(12) United States Patent
Kim et al.

(10) Patent No.: US 10,913,755 B2
(45) Date of Patent: Feb. 9, 2021

(54) TRANSITION METAL COMPOUND, PREPARATION METHOD THEREFOR, AND COMPOSITION FOR DEPOSITING TRANSITION METAL-CONTAINING THIN FILM, CONTAINING SAME

(71) Applicant: DNF CO., LTD., Daejeon (KR)

(72) Inventors: Myong Woon Kim, Daejeon (KR); Sang Ick Lee, Daejeon (KR); Won Mook Chae, Daejeon (KR); Sang Jun Yim, Cheongju-si (KR); Kang Yong Lee, Sejong (KR); A Ra Cho, Gwangju (KR); Sang Yong Jeon, Sejong (KR); Haeng Don Lim, Daejeon (KR)

(73) Assignee: DNF CO., LTD., Daejeon (KR)

( * ) Notice: Subject to any disclaimer, the term of this patent is extended or adjusted under 35 U.S.C. 154(b) by 0 days.

(21) Appl. No.: 16/093,012

(22) PCT Filed: Apr. 6, 2017

(86) PCT No.: PCT/KR2017/003782
§ 371 (c)(1),
(2) Date: Oct. 11, 2018

(87) PCT Pub. No.: WO2017/179857
PCT Pub. Date: Oct. 19, 2017

(65) Prior Publication Data
US 2019/0135840 A1    May 9, 2019

(30) Foreign Application Priority Data

Apr. 12, 2016  (KR) .................. 10-2016-0044683
Mar. 29, 2017  (KR) .................. 10-2017-0040141

(51) Int. Cl.
*C07F 7/10*    (2006.01)
*C23C 16/455*  (2006.01)
(Continued)

(52) U.S. Cl.
CPC ............. *C07F 7/10* (2013.01); *C23C 16/18* (2013.01); *C23C 16/30* (2013.01); *C23C 16/401* (2013.01);
(Continued)

(58) Field of Classification Search
None
See application file for complete search history.

(56) References Cited

U.S. PATENT DOCUMENTS 6,635,778 B1 * 10/2003 Royo .................... B01J 31/143
                                                   502/102

FOREIGN PATENT DOCUMENTS

KR    20070121281 A    12/2007
KR    20120042971 A    5/2012
KR    20120078025 A    7/2012

OTHER PUBLICATIONS

Valade, L. et al., "Evaluation of the simultaneous use of Cp2VMe2 and CpTiCl2N(SiMe3)2 as precursors to ceramic thin films containing titanium and vanadium: Towards titanium-vanadium carbonitride," Applied Organometallic Chemistry, vol. 12, No. 3, Dec. 4, 1998, 15 pages.
(Continued)

*Primary Examiner* — Clinton A Brooks
(74) *Attorney, Agent, or Firm* — McCoy Russell LLP

(57) ABSTRACT

The present invention relates to: a novel transition metal compound; a preparation method therefor; a composition for depositing a transition metal-containing thin film, containing the same; a transition metal-containing thin film using the composition for depositing a transition metal-containing thin film; and a method for preparing a transition metal-containing thin film. The transition metal compound of the present invention has high thermal stability, high volatility, and high storage stability, and thus a transition metal-
(Continued)

containing thin film having high-density and high-purity can be easily prepared by using the same as a precursor.

7 Claims, 2 Drawing Sheets

(51) Int. Cl.
    *C23C 16/40*     (2006.01)
    *C23C 16/18*     (2006.01)
    *C23C 16/30*     (2006.01)

(52) U.S. Cl.
    CPC ...... *C23C 16/405* (2013.01); *C23C 16/45525* (2013.01); *C23C 16/45553* (2013.01)

(56) References Cited

OTHER PUBLICATIONS

ISA Korean Intellectual Property Office, International Search Report Issued in Application No. PCT/KR2017/003782, dated Jul. 17, 2017, WIPO, 4 pages.

\* cited by examiner

TRANSITION METAL COMPOUND, PREPARATION METHOD THEREFOR, AND COMPOSITION FOR DEPOSITING TRANSITION METAL-CONTAINING THIN FILM, CONTAINING SAME

CROSS-REFERENCE TO RELATED APPLICATIONS

The present application is a U.S. National Phase of International Patent Application Serial No. PCT/KR2017/003782 entitled "TRANSITION METAL COMPOUND, PREPARATION METHOD THEREFOR, AND COMPOSITION FOR DEPOSITING TRANSITION METAL-CONTAINING THIN FILM, CONTAINING SAME," filed on Apr. 6, 2017. International Patent Application Serial No. PCT/KR2017/003782 claims priority to Korean Patent Application No. 10-2016-0044683, filed on Apr. 12, 2016 and Korean Patent Application No. 10-2017-0040141, filed on Mar. 29, 2017. The entire contents of each of the above-cited applications are hereby incorporated by reference in their entirety for all purposes.

TECHNICAL FIELD

The present invention relates to a novel transition metal compound, a preparation method thereof, and a composition for depositing a transition metal-containing thin film including the same, and more specifically, to a novel transition metal compound capable of being effectively used as a precursor of a transition metal-containing thin film, a preparation method thereof, a composition for depositing a transition metal-containing thin film including the same, a transition metal-containing thin film using the composition for depositing a transition metal-containing thin film, and a preparation method of the transition metal-containing thin film.

BACKGROUND ART

In a semiconductor process, silicon oxide ($SiO_2$) has been mainly used as a gate dielectric. Such a silicon oxide has a simple preparation process but has a relatively low dielectric constant, and thus, a gate-to-channel leakage current occurs when the silicon oxide has a thin thickness.

To solve the problem, a study on a high-k material as a high dielectric material in which dielectric loss is low due to excellent dielectric properties and high dielectric constant has been actively conducted.

In addition, in accordance with integration and miniaturization of a semiconductor device, there is an increasing demand for a precursor compound having high heat stability as a high dielectric material, and high volatility, and being present as a liquid at room temperature as much as possible so as to be applicable to various processes (for example, atomic layer deposition (ALD), chemical vapor deposition (CVD)) that are able to have an excellent step coverage characteristic even in fine patterns.

For example, preparation of a zirconium oxide thin film by the atomic layer deposition or the chemical vapor deposition using a zirconium precursor has been developed in various ways depending on a ligand structure of the zirconium precursor.

The zirconium oxide thin film by the atomic layer deposition or the chemical vapor deposition using inorganic salts such as $ZrCl_4$, $ZrI_4$, $ZrF_4$, etc., has problems in that electrical characteristics of the thin film are deteriorated and an agglomeration phenomenon of the thin film is easily caused since the inorganic salts ($Cl^-$, $F^-$, $I^-$) remain in the thin film. Further, roughness of the zirconium oxide film may not be arbitrarily adjusted, and it is also difficult to adjust a thickness of the thin film.

A zirconium oxide thin film using a zirconium alkoxide precursor is disclosed in a document [see Master. Chem., 1994, 4, 1815], wherein $Zr(OtBu)_4$ is used as the precursor. However, since $Zr(OtBu)_4$ is considerably difficult to handle in a preparation process of a thin film and a catalytic hydrolytic decomposition reaction occurs in a very small amount of water due to very high reactivity, and a storage life is very short.

Further, the zirconium oxide thin film formed by using a zirconium compound in which an amido ligand is coordinated, as the precursor, is disclosed in the document [see Chem. Mater., 2002, 14, 4350]. A zirconium amido compound represented by $Zr(NMeEt)_4$ or $Zr(NEt_2)_4$ is in a liquid state in which a viscosity is low at room temperature, and has very high vapor pressure, and it is easy to remove the amido ligand by ozone and water vapor, and thus, the zirconium amido compound is the most widely used as a precursor for preparing a $ZrO_2$ thin film using the atomic layer deposition. However, these zirconium amido compounds are not easy to be stored for long-term due to high reactivity, and in particular, it is recently known that the zirconium amido compounds decompose during vaporization due to low heat stability, which significantly affects quality of the thin film.

Efforts have been made to overcome disadvantages of the above-described conventional inorganic salts, alkoxides and amido ligands and to improve heat stability of the zirconium precursor. For example, a zirconium precursor such as $CpZr(N(CH_3)_2)_3$ having an amido group and a cyclopentadiene (Cp) group as the ligand are known, but satisfactory results have not yet been obtained.

Therefore, there is still a need for a study on a precursor for thin film deposition having more excellent characteristics than those of compounds used as conventional precursors for thin film deposition.

DISCLOSURE

Technical Problem

An object of the present invention is to provide a transition metal compound having excellent heat stability to be usable as a precursor for thin film deposition, and a preparation method thereof.

Another object of the present invention is to provide a composition for depositing a transition metal-containing thin film including the transition metal compound of the present invention, a transition metal-containing thin film prepared by using the same, and a preparation method of the transition metal-containing thin film using the same.

Technical Solution

In one general aspect, there is provided a transition metal compound having high volatility, excellent heat stability, and excellent cohesion force to be usable as a precursor for thin film deposition, wherein the transition metal compound is represented by Chemical Formula 1 below:

[Chemical Formula 1]

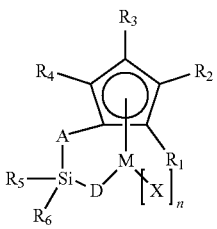

in Chemical Formula 1,

M is a transition metal of Group 4 in the periodic table;

$R_1$ to $R_4$ are each independently a hydrogen atom or a (C1-C20)alkyl group;

$R_5$ and $R_6$ are each independently a hydrogen atom, a (C1-C20)alkyl group, a (C6-C20)aryl group, a (C6-C20)aryl(C1-C20)alkyl group, or a (C1-C20)alkoxy group;

A is —$(CR_{11}R_{12})_a$—, $R_{11}$ and $R_{12}$ are each independently hydrogen, a (C1-C20)alkyl group, a (C6-C20)aryl group, a (C6-C20)aryl(C1-C20)alkyl group, or a (C1-C20)alkoxy group, and a is an integer of 1 to 3;

D is —$N(R_{13})$—, and $R_{13}$ is a hydrogen atom, a (C1-C20)alkyl group, a (C3-C20)cycloalkyl group, a (C6-C20)aryl group, a (C6-C20)aryl(C1-C20)alkyl group, a (C1-C20)alkylcarbonyl group, or a (C3-C20)cycloalkylcarbonyl group;

X is each independently a (C1-C20)alkyl group, a (C6-C20)aryl group, a (C6-C20)aryl(C1-C20)alkyl group, a (C1-C20)alkoxy group, a silyl group unsubstituted or substituted with (C3-C20)alkyl, a (C3-C20)heterocycloalkyl group, an amino group unsubstituted or substituted with (C1-C20)alkyl or (C6-C20)aryl, an amide group unsubstituted or substituted with (C1-C20)alkyl or (C6-C20)aryl, a phosphine group unsubstituted or substituted with (C1-C20)alkyl or (C6-C20)aryl, a phosphido group unsubstituted or substituted with (C1-C20)alkyl or (C6-C20)aryl, provided that a case where X is a cyclopentadienyl derivative is excluded;

the alkyl group, the cycloalkyl group, the aryl group, the arylalkyl group, the alkylcarbonyl group, the cycloalkylcarbonyl group, or the alkoxy group of $R_1$ to $R_6$, A, D, and X may be further substituted with a (C1-C20)alkyl group, a (C3-C20)cycloalkyl group, a (C6-C20)aryl group, or a (C6-C20)aryl(C10-C20)alkyl group; and n is an integer of 1 or 2.

Preferably, in Chemical Formula 1 according to an exemplary embodiment of the present invention, M may be titanium, zirconium, or hafnium, and $R_1$ to $R_6$ may be each independently a hydrogen atom or a (C1-C7)alkyl group.

Preferably, in Chemical Formula 1 according to an exemplary embodiment of the present invention, $R_{11}$ to $R_{13}$ may be each independently a hydrogen atom or a (C1-C20)alkyl group, and X may be each independently an amino group unsubstituted or substituted with (C1-C20)alkyl or (C6-C20)aryl, an amide group unsubstituted or substituted with (C1-C20)alkyl or (C6-C20)aryl, a (C1-C20)alkyl group, a (C3-C20)heterocycloalkyl group, or a (C1-C20)alkoxy group.

Preferably, in Chemical Formula 1 according to an exemplary embodiment of the present invention, M may be titanium, zirconium, or hafnium, $R_1$ to $R_6$ may be each independently a hydrogen atom or a (C1-C7)alkyl group; and X may be each independently an amino group substituted with (C1-C20)alkyl, a (C1-C20)alkyl group, a (C3-C20)heterocycloalkyl group, or a (C1-C20)alkoxy group.

The transition metal compound represented by Chemical Formula 1 according to an exemplary embodiment of the present invention may be selected from the following compounds:

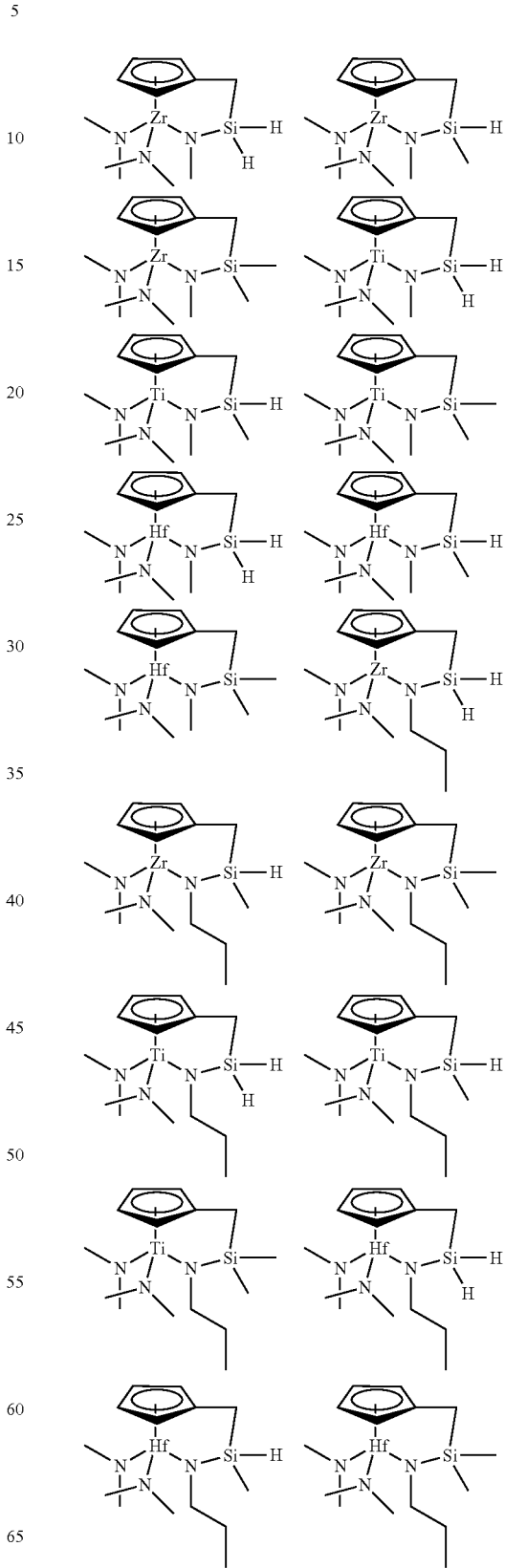

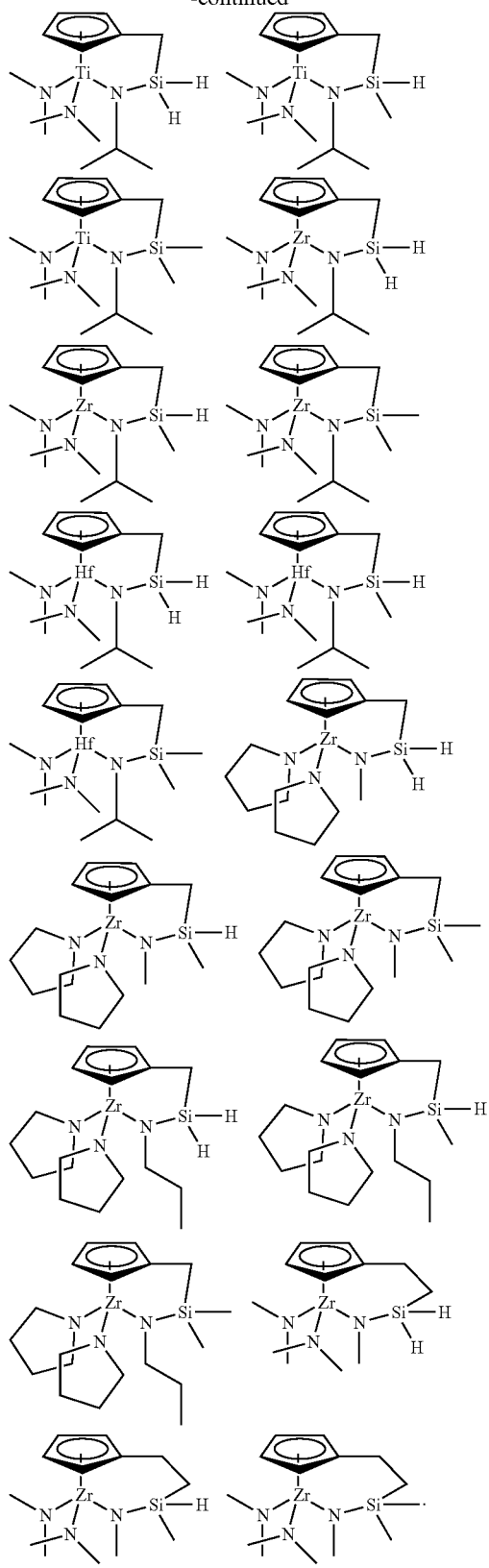

Chemical Formula 2 below with Chemical Formula 3 below to prepare the transition metal compound represented by Chemical Formula 1 below:

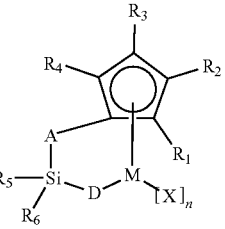

[Chemical Formula 1]

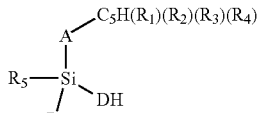

[Chemical Formula 2]

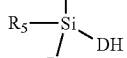

[Chemical Formula 3]

M(X)$_4$ in Chemical Formulas 1 to 3,

M is a transition metal of Group 4 in the periodic table;

$R_1$ to $R_4$ are each independently a hydrogen atom or a (C1-C20)alkyl group;

$R_5$ and $R_6$ are each independently a hydrogen atom, a (C1-C20)alkyl group, a (C6-C20)aryl group, a (C6-C20)aryl (C1-C20)alkyl group, or a (C1-C20)alkoxy group;

A is —(CR$_{11}$R$_{12}$)$_a$—, R$_{11}$ and R$_{12}$ are each independently hydrogen, a (C1-C20)alkyl group, a (C6-C20)aryl group, a (C6-C20)aryl(C1-C20)alkyl group, or a (C1-C20)alkoxy group, and a is an integer of 1 to 3;

D is —N(R$_{13}$)—, and R$_{13}$ is a hydrogen atom, a (C1-C20)alkyl group, a (C3-C20)cycloalkyl group, a (C6-C20) aryl group, a (C6-C20)aryl(C1-C20)alkyl group, a (C1-C20) alkylcarbonyl group, or a (C3-C20)cycloalkylcarbonyl group;

X is each independently a (C1-C20)alkyl group, a (C6-C20)aryl group, a (C6-C20)aryl(C1-C20)alkyl group, a (C1-C20)alkoxy group, a silyl group unsubstituted or substituted with (C3-C20)alkyl, a (C3-C20)heterocycloalkyl group, an amino group unsubstituted or substituted with (C1-C20) alkyl or (C6-C20)aryl, an amide group unsubstituted or substituted with (C1-C20)alkyl or (C6-C20)aryl, a phosphine group unsubstituted or substituted with (C1-C20)alkyl or (C6-C20)aryl, a phosphido group unsubstituted or substituted with (C1-C20)alkyl or (C6-C20)aryl, provided that a case where X is a cyclopentadienyl derivative is excluded;

the alkyl group, the cycloalkyl group, the heterocycloalkyl group, the aryl group, the arylalkyl group, the alkylcarbonyl group, the cycloalkylcarbonyl group, or the alkoxy group of $R_1$ to $R_6$, A, D, and X may be further substituted with a (C1-C20)alkyl group, a (C3-C20)cycloalkyl group, a (C6-C20)aryl group, or a (C6-C20)aryl(C10-C20)alkyl group; and n is an integer of 1 or 2.

The Chemical Formula 2 according to an exemplary embodiment of the present invention may be prepared by reacting Chemical Formula 4 below with Chemical Formula 5 below to prepare Chemical Formula 6 below, and then reacting the Chemical Formula 6 with Chemical Formula 7 below:

In another general aspect, there is provided a method for preparing a transition metal compound represented by Chemical Formula 1 below, the method including reacting

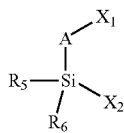

[Chemical Formula 4]

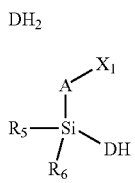

DH$_2$

[Chemical Formula 5]

[Chemical Formula 6]

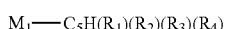

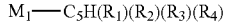

[Chemical Formula 7]

in Chemical Formulas 4 to 7,

M$_1$ is an alkali metal;

R$_1$ to R$_4$ are each independently a hydrogen atom or a (C1-C20)alkyl group;

R$_5$ and R$_6$ are each independently a hydrogen atom, a (C1-C20)alkyl group, a (C6-C20)aryl group, a (C6-C20)aryl(C1-C20)alkyl group, or a (C1-C20)alkoxy group;

A is —(CR$_{11}$R$_{12}$)$_a$—, R$_{11}$ and R$_{12}$ are each independently hydrogen, a (C1-C20)alkyl group, a (C6-C20)aryl group, a (C6-C20)aryl(C1-C20)alkyl group, or a (C1-C20)alkoxy group, and a is an integer of 1 to 3;

D is —N(R$_{13}$)—, and R$_{13}$ is a hydrogen atom, a (C1-C20)alkyl group, a (C3-C20)cycloalkyl group, a (C6-C20)aryl group, a (C6-C20)aryl(C1-C20)alkyl group, a (C1-C20)alkylcarbonyl group, or a (C3-C20)cycloalkylcarbonyl group;

the alkyl group, the cycloalkyl group, the aryl group, the arylalkyl group, the alkylcarbonyl group, the cycloalkylcarbonyl group, or the alkoxy group of R$_1$ to R$_6$, A, and D may be further substituted with a (C1-C20)alkyl group, a (C3-C20)cycloalkyl group, a (C6-C20)aryl group, or a (C6-C20)aryl(C10-C20)alkyl group;

X$_1$ and X$_2$ are each independently halogen; and n is an integer of 1 or 2.

In still another general aspect, there is provided a composition for depositing a transition metal-containing thin film including the transition metal compound as described above.

Preferably, a transition metal of the transition metal compound included in the composition for depositing a transition metal-containing thin film may be zirconium, hafnium or titanium.

In still another general aspect, there is provided a transition metal-containing thin film prepared by using the composition for depositing a transition metal-containing thin film as described above, and a preparation method of the transition metal-containing thin film.

Advantageous Effects

The novel transition metal compound of the present invention may have high volatility, and excellent heat stability and cohesion force to be usable as a precursor of a transition metal-containing thin film.

In addition, the novel transition metal compound of the present invention is mostly present as a liquid at room temperature due to a low melting point, and has significantly excellent storage stability due to high heat stability.

The composition for depositing a transition metal-containing thin film of the present invention may be applied to various thin film deposition methods by including the transition metal compound of the present invention having high heat stability as the precursor, and the thin film prepared by using the composition for depositing a transition metal-containing thin film may have a high density and a high purity.

The composition for depositing a transition metal-containing thin film of the present invention may include the transition metal compound of the present invention which has high volatility, and excellent heat stability and cohesion force, and is mostly present as a liquid at room temperature due to a low melting point, as the precursor, and thus, when the transition metal thin film is formed by using the composition for depositing a transition metal-containing thin film of the present invention, it is possible to obtain a thin film having an excellent step coverage characteristic, a high density, and a high purity.

BEST MODE

Figure 1:
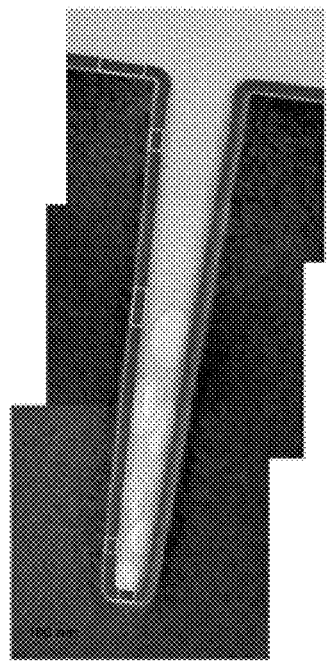
FIG. 1 shows a step coverage characteristic of Experimental Example 2.

Hereinafter, a novel transition metal compound according to the present invention and a preparation method thereof are described in detail. Here, unless technical and scientific terms used herein are defined otherwise, they have meanings understood by those skilled in the art to which the present invention pertains. Known functions and components that may obscure the gist of the present invention with unnecessary detail will be omitted.

The present invention provides a transition metal compound having high volatility, excellent heat stability, and excellent cohesion force, wherein the transition metal compound is represented by Chemical Formula 1 below:

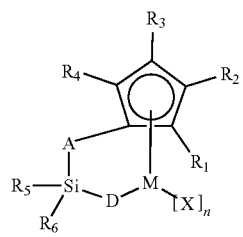

[Chemical Formula 1]

in Chemical Formula 1,

M is a transition metal of Group 4 in the periodic table;

R$_1$ to R$_4$ are each independently a hydrogen atom or a (C1-C20)alkyl group;

R$_5$ and R$_6$ are each independently a hydrogen atom, a (C1-C20)alkyl group, a (C6-C20)aryl group, a (C6-C20)aryl(C1-C20)alkyl group, or a (C1-C20)alkoxy group;

A is —(CR$_{11}$R$_{12}$)$_a$—, R$_{11}$ and R$_{12}$ are each independently hydrogen, a (C1-C20)alkyl group, a (C6-C20)aryl group, a (C6-C20)aryl(C1-C20)alkyl group, or a (C1-C20)alkoxy group, and a is an integer of 1 to 3;

D is —N($R_{13}$)—, and $R_{13}$ is a hydrogen atom, a (C1-C20)alkyl group, a (C3-C20)cycloalkyl group, a (C6-C20)aryl group, a (C6-C20)aryl(C1-C20)alkyl group, a (C1-C20)alkylcarbonyl group, or a (C3-C20)cycloalkylcarbonyl group;

X is each independently a (C1-C20)alkyl group, a (C6-C20)aryl group, a (C6-C20)aryl(C1-C20)alkyl group, a (C1-C20)alkoxy group, a silyl group unsubstituted or substituted with (C3-C20)alkyl, a (C3-C20)heterocycloalkyl group, an amino group unsubstituted or substituted with (C1-C20)alkyl or (C6-C20)aryl, an amide group unsubstituted or substituted with (C1-C20)alkyl or (C6-C20)aryl, a phosphine group unsubstituted or substituted with (C1-C20)alkyl or (C6-C20)aryl, a phosphido group unsubstituted or substituted with (C1-C20)alkyl or (C6-C20)aryl, provided that a case where X is a cyclopentadienyl derivative is excluded;

the alkyl group, the cycloalkyl group, the aryl group, the arylalkyl group, the alkylcarbonyl group, the cycloalkylcarbonyl group, or the alkoxy group of $R_1$ to $R_6$, A, D, and X may be further substituted with a (C1-C20)alkyl group, a (C3-C20)cycloalkyl group, a (C6-C20)aryl group, or a (C6-C20)aryl(C10-C20)alkyl group; and n is an integer of 1 or 2.

The transition metal compound represented by Chemical Formula 1 of the present invention may have high volatility and high heat stability to be easily usable as a precursor for preparing a transition metal-containing thin film.

In addition, the transition metal compound represented by Chemical Formula 1 of the present invention has a low melting point and is mostly present as a liquid at room temperature, thereby having high storage stability, and thus, a thin film having a high density and a high purity may be prepared by using the transition metal compound.

In addition, unlike the related art in which a mixture of two materials, that is, a transition metal precursor and a silicon precursor, is used as a precursor to prepare a transition metal silicate thin film, the transition metal compound represented by Chemical Formula 1 of the present invention may include silicon and a transition metal included in one molecule. Therefore, it is possible to prepare the transition metal silicate thin film with only one precursor, which is economical and efficient, and has very excellent purity of the thin film.

Specifically, according to an exemplary embodiment of the present invention, X may be each independently a (C1-C20)alkyl group, a (C3-C20)heterocycloalkyl group, a (C6-C20)aryl group, a (C6-C20)aryl(C1-C20)alkyl group, a (C1-C20)alkoxy group, a silyl group substituted with (C3-C20)alkyl, a mono(C1-C20)alkylamino group, a di(C1-C20)alkylamino group, a mono(C1-C20)alkylamide group, a di(C1-C20)alkylamide group, a phosphine group substituted with (C1-C20)alkyl or a phosphido group substituted with (C1-C20)alkyl, and preferably, may be an amino group substituted with (C1-C20)alkyl, a (C1-C20)alkyl group, a (C3-C20)heterocycloalkyl group or a (C1-C20)alkoxy group, and more preferably, a mono(C1-C20)alkylamino group, a di(C1-C20)alkylamino group, or a (C3-C20)heterocycloalkyl group, provided that a case where X is a cyclopentadienyl derivative is excluded.

Preferably, the M according to an exemplary embodiment of the present invention may be titanium, zirconium or hafnium in view of increasing a dielectric constant.

Preferably, $R_1$ to $R_6$ according to an exemplary embodiment of the present invention may be each independently a hydrogen atom or a(C1-C7)alkyl group, and specifically, may be each independently a hydrogen atom, a methyl group, an ethyl group, an n-propyl group, an isopropyl group, an n-butyl group, a sec-butyl group, a tert-butyl group or an n-pentyl group.

Preferably, $R_{11}$ and $R_{12}$ of the substituent A according to an exemplary embodiment of the present invention may be each independently a hydrogen atom, a (C1-C20)alkyl group, a (C6-C20)aryl group, a (C6-C20)aryl(C1-C20)alkyl group or a (C1-C20)alkoxy group, and may be preferably a hydrogen atom or a (C1-C20)alkyl group, and specifically, a methyl group, an ethyl group, an n-propyl group, an isopropyl group, an n-butyl group, a sec-butyl group, a tert-butyl group, or an n-pentyl group, and a may be an integer of 1 to 3, preferably an integer of 1 to 2.

Preferably, $R_{13}$ of the substituent D according to an exemplary embodiment of the present invention may be a hydrogen atom, a (C1-C20)alkyl group, a (C3-C20)cycloalkyl group, a (C6-C20)aryl group, a (C6-C20)aryl(C1-C20)alkyl group, a (C1-C20)alkylcarbonyl group or a (C3-C20)cycloalkylcarbonyl group, and specific examples thereof may include a methyl group, an ethyl group, an n-propyl group, an isopropyl group, a sec-butyl group or a tert-butyl group, a cyclohexyl group, a dicyclohexylmethyl group, an adamantyl group, a phenyl group, a phenylmethyl group, a methylcarbonyl group, an ethylcarbonyl group, an n-propylcarbonyl group, an isopropylcarbonyl group, a tert-butylcarbonyl group or an adamantylcarbonyl group, and preferably, a methyl group, an ethyl group, an n-propyl group, an isopropyl group, a sec-butyl group or a tert-butyl group, a cyclohexyl group, a dicyclohexylmethyl group, an adamantyl group, a phenyl group, a phenylmethyl group, a methylcarbonyl group, an ethylcarbonyl group, an n-propylcarbonyl group, an isopropylcarbonyl group, a tert-butylcarbonyl group or an adamantylcarbonyl group, and preferably, a hydrogen atom or a (C1-C20)alkyl group, and preferred specific examples thereof may include a methyl group, an ethyl group, an n-propyl group, an isopropyl group, a sec-butyl group, or a tert-butyl group.

Preferably, X according to an exemplary embodiment of the present invention may be each independently a mono (C1-C20)alkylamino group, a di(C1-C20)alkylamino group, a mono(C1-C20)alkylamide group, a di(C1-C20)alkylamide group, a (C1-C20)alkyl group, a (C3-C20)heterocycloalkyl group, or a (C1-C20)alkoxy group, and more preferably, a mono(C1-C20)alkylamino group, a di(C1-C20)alkylamino group, a (C1-C20)alkyl group, a (C3-C20)heterocycloalkyl group, or a (C1-C20)alkoxy group. Examples of the mono (C1-C20)alkylamino group and the di(C1-C20)alkylamino group may include a methylamino group, an ethylamino group, an n-propylamino group, an isopropylamino group, an n-butylamino group, a sec-butylamino group, a tert-butylamino group, an isobutylamino group, an n-hexylamino group, an n-octylamino group, an n-decylamino group, a dimethylamino group, a diethylamino group, a di-n-propylamino group, a diisopropylamino group, a di-n-butylamino group, a di-sec-butylamino group, a di-tert-butylamino group, a diisobutylamino group, a tert-butylisopropylamino group, a di-n-hexylamino group, a di-n-octylamino group, a di-n-decylamino group, and among them, preferably, a dimethylamino group, a diethylamino group or a diisopropylamino group. Specific examples of the (C1-C20)alkyl group may include an n-propyl group, an isopropyl group, an n-butyl group, a sec-butyl group, a tert-butyl group, an n-pentyl group, a neopentyl group, an n-hexyl group, an n-octyl group, an n-decyl group, an n-dodecyl group, an n-pentadecyl group, or an n-eicosyl group, and among them, preferably, a methyl group, an ethyl group, an isopropyl group or a tert-butyl group. Specific examples of the (C3-C20)heterocycloalkyl group may include an aziridinyl group, a pyrrolidinyl group, a piperidinyl group, an azepanyl group, or an azocanyl group, and preferably, a pyrrolidinyl group or a piperidinyl group. Specific examples of the (C1-C20)alkoxy group may include a methoxy group, an ethoxy group, an n-propoxy group, an isopropoxy group, an n-butoxy group, a sec-butoxy group, a tert-butoxy group, an n-pentoxy group, a neopentoxy group, an n-hexyloxy group, an n-octoxy group, or an n-dodexoxy group, and among them, preferably, a methoxy group, an ethoxy group, an isopropoxy group, or a tert-butoxy group.

In view of obtaining a good quality transition metal-containing thin film by using the transition metal compound having high volatility and high heat stability according to an exemplary embodiment of the present invention as a precursor for depositing a transition metal-containing thin film, preferably, $R_1$ to $R_6$ may be each independently a hydrogen atom or a (C1-C7)alkyl group; X may be each independently a mono(C1-C20)alkylamino group, a di(C1-C20)alkylamino group, a (C1-C20)alkyl group, a (C3-C20)heterocycloalkyl group, or a (C1-C20)alkoxy group, and more preferably, M may be zirconium, hafnium, or titanium; $R_1$ to $R_6$ may be each independently a hydrogen atom or a (C1-C7)alkyl group; and X may be each independently of a di(C1-C20) alkylamino group or a (C1-C20)alkoxy group.

The transition metal compound represented by Chemical Formula 1 above of the present invention may be selected from the following compounds, but the present invention is not limited thereto:

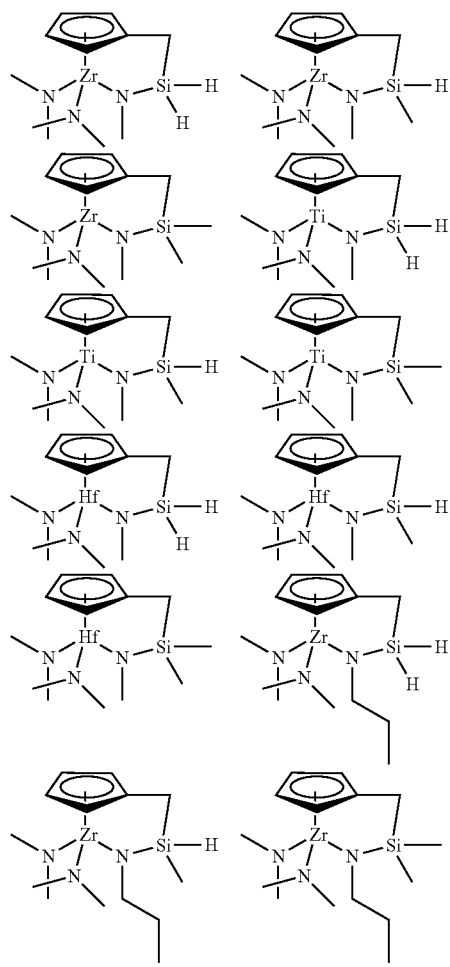

-continued

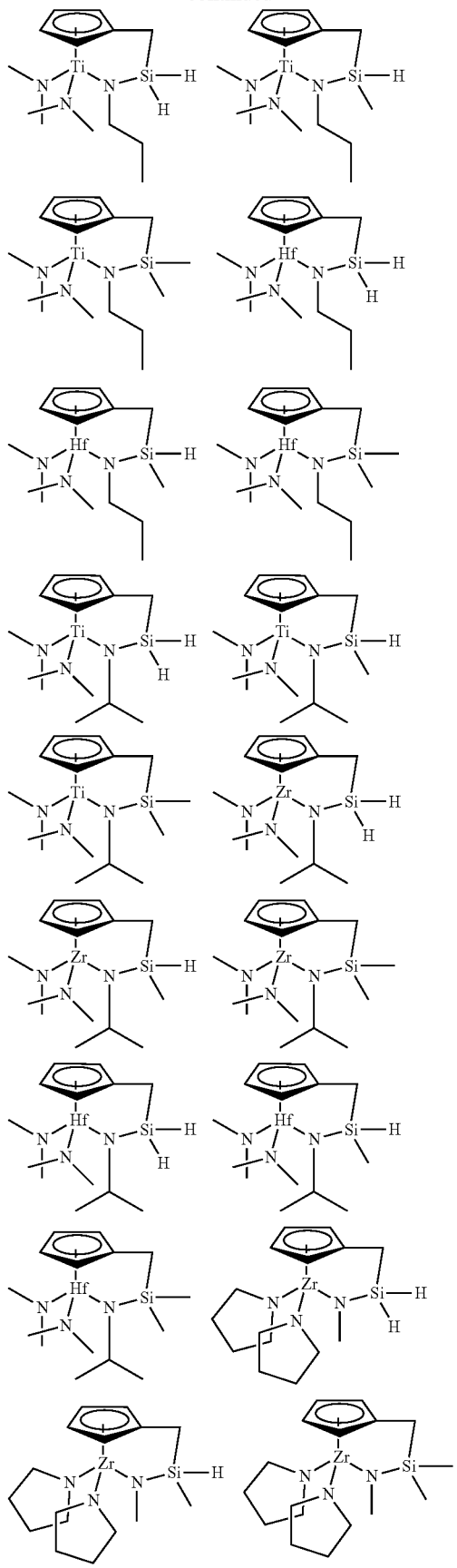

-continued

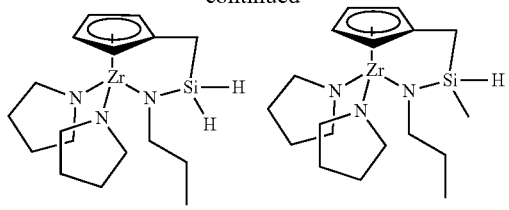

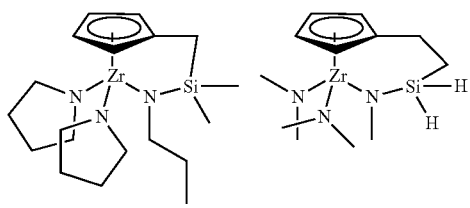

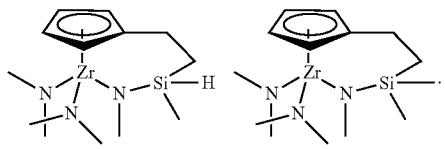

⌈Alkyl⌋, ⌈alkoxy⌋, and other substituents including ⌈alkyl⌋ part used herein include all linear or branched types, and have 1 to 20 carbon atoms, preferably, 1 to 10 carbon atoms, and more preferably, 1 to 4 carbon atoms.

In addition, ⌈aryl⌋ used herein, which is an organic radical derived from aromatic hydrocarbon by removal of one hydrogen, includes single or fused ring system properly including 4 to 7 ring atoms, preferably, 5 or 6 ring atoms in each ring, and even includes a form in which a plurality of aryls are linked with a single bond. Specific examples of aryl include phenyl, naphthyl, biphenyl, anthryl, indenyl, fluorenyl, and the like, but the present invention is not limited thereto.

⌈Cycloalkyl⌋ used herein refers to a non-aromatic monocyclic or multicyclic ring system having 3 to 20 carbon atoms, wherein the monocyclic ring includes cyclopropyl, cyclobutyl, cyclopentyl, and cyclohexyl, but is not limited thereto. Examples of the multicyclic cycloalkyl group include perhydronaphthyl, perhydroindenyl, etc.; and examples of a bridged multicyclic cycloalkyl group include adamantly, norbornyl, etc.

⌈Heterocycloalkyl⌋ used herein refers to a substituted or unsubstituted, non-aromatic 3- to 15-membered ring radical composed of carbon atoms and 1 to 5 hetero atoms selected from nitrogen, phosphorus, oxygen and sulfur. A heterocycloalkyl radical may be a monocyclic, bicyclic or tricyclic ring system which may be fused, bridged or may include a spirocyclic ring system, and the nitrogen, phosphorus, carbon, oxygen or sulfur atom in the heterocyclic ring radical may be oxidized to various oxidation states if necessary. In addition, the nitrogen atom may be quaternized, if necessary.

The present invention provides a method for preparing a transition metal compound represented by Chemical Formula 1 below, wherein the method includes reacting Chemical Formula 2 below with Chemical Formula 3 below to prepare the transition metal compound represented by Chemical Formula 1 below:

[Chemical Formula 1]

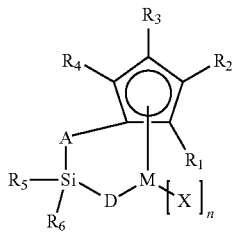

[Chemical Formula 2]

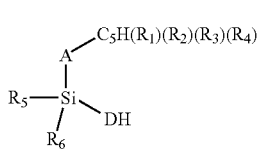

[Chemical Formula 3]

$M(X)_4$ in Chemical Formulas 1 to 3,

M is a transition metal of Group 4 in the periodic table;

$R_1$ to $R_4$ are each independently a hydrogen atom or a (C1-C20)alkyl group;

$R_5$ and $R_6$ are each independently a hydrogen atom, a (C1-C20)alkyl group, a (C6-C20)aryl group, a (C6-C20)aryl(C1-C20)alkyl group, or a (C1-C20)alkoxy group;

A is $-(CR_{11}R_{12})_a-$, $R_{11}$ and $R_{12}$ are each independently hydrogen, a (C1-C20)alkyl group, a (C6-C20)aryl group, a (C6-C20)aryl(C1-C20)alkyl group, or a (C1-C20)alkoxy group, and a is an integer of 1 to 3;

D is $-N(R_{13})-$, and $R_{13}$ is a hydrogen atom, a (C1-C20)alkyl group, a (C3-C20)cycloalkyl group, a (C6-C20)aryl group, a (C6-C20)aryl(C1-C20)alkyl group, a (C1-C20)alkylcarbonyl group, or a (C3-C20)cycloalkylcarbonyl group;

X is each independently a (C1-C20)alkyl group, a (C6-C20)aryl group, a (C6-C20)aryl(C1-C20)alkyl group, a (C1-C20)alkoxy group, a silyl group unsubstituted or substituted with (C3-C20)alkyl, a (C3-C20)heterocycloalkyl group, an amino group unsubstituted or substituted with (C1-C20) alkyl or (C6-C20)aryl, an amide group unsubstituted or substituted with (C1-C20)alkyl or (C6-C20)aryl, a phosphine group unsubstituted or substituted with (C1-C20)alkyl or (C6-C20)aryl, a phosphido group unsubstituted or substituted with (C1-C20)alkyl or (C6-C20)aryl, provided that a case where X is a cyclopentadienyl derivative is excluded;

the alkyl group, the cycloalkyl group, the aryl group, the arylalkyl group, the alkylcarbonyl group, the cycloalkylcarbonyl group, or the alkoxy group of $R_1$ to $R_6$, A, D, and X may be further substituted with a (C1-C20)alkyl group, a (C3-C20)cycloalkyl group, a (C6-C20)aryl group, or a (C6-C20)aryl(C10-C20)alkyl group; and n is an integer of 1 or 2.

Chemical Formula 2 according to an exemplary embodiment of the present invention may be prepared by reacting Chemical Formula 4 below with Chemical Formula 5 below to prepare Chemical Formula 6 below, and then reacting the Chemical Formula 6 with Chemical Formula 7 below:

[Chemical Formula 4]

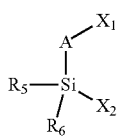

-continued

[Chemical Formula 5]

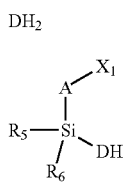

[Chemical Formula 6]

[Chemical Formula 7]

$M_1$—$C_5H(R_1)(R_2)(R_3)(R_4)$ in Chemical Formulas 4 to 7, $M_1$ is an alkali metal;

$R_1$ to $R_4$ are each independently a hydrogen atom or a (C1-C20)alkyl group;

$R_5$ and $R_6$ are each independently a hydrogen atom, a (C1-C20)alkyl group, a (C6-C20)aryl group, a (C6-C20)aryl(C1-C20)alkyl group, or a (C1-C20)alkoxy group;

A is —$(CR_{11}R_{12})_a$—, $R_{11}$ and $R_{12}$ are each independently hydrogen, a (C1-C20)alkyl group, a (C6-C20)aryl group, a (C6-C20)aryl(C1-C20)alkyl group, or a (C1-C20)alkoxy group, and a is an integer of 1 to 3;

D is —$N(R_{13})$—, and $R_{13}$ is a hydrogen atom, a (C1-C20)alkyl group, a (C3-C20)cycloalkyl group, a (C6-C20)aryl group, a (C6-C20)aryl(C1-C20)alkyl group, a (C1-C20)alkylcarbonyl group, or a (C3-C20)cycloalkylcarbonyl group;

the alkyl group, the cycloalkyl group, the aryl group, the arylalkyl group, the alkylcarbonyl group, the cycloalkylcarbonyl group, or the alkoxy group of $R_1$ to $R_6$, A, and D may be further substituted with a (C1-C20)alkyl group, a (C3-C20)cycloalkyl group, a (C6-C20)aryl group, or a (C6-C20)aryl(C10-C20)alkyl group;

$X_1$ and $X_2$ are each independently halogen; and n is an integer of 1 or 2.

A compound wherein X in the Chemical Formula 1 according to an exemplary embodiment of the present invention is heterocycloalkyl may be prepared by preparing a compound wherein X in the Chemical Formula 1 has a monoalkylamino group or a dialkylamino group, followed by reaction with heterocycloalkyl, for example, pyrrolidine and piperidine.

The preparation method of the present invention may be shown by Reaction Schemes 1 to 3 below:

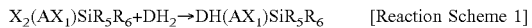 [Reaction Scheme 1]

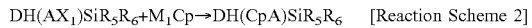 [Reaction Scheme 2]

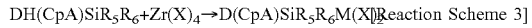 [Reaction Scheme 3]

in Reaction Schemes 1 to 3, A, D, X, M, $R_5$, $R_6$, $X_1$, $X_2$, and $M_1$ are the same as defined in Chemical Formula 1 above, and CP is cyclopentadienyl.

A solvent used in the preparation method of the present invention may be any conventional organic solvent, and may be preferably at least one selected from the group consisting of hexane, pentane, dichloromethane (DCM), dichloroethane (DCE), toluene, acetonitrile (MeCN), nitromethane, tetrahydrofuran (THF), N,N-dimethylformamide (DMF), and N,N-dimethylacetamide (DMA).

The reaction temperature may be any temperature used in conventional organic synthesis, but may be varied depending on amounts of a reaction material and a starting material, and preferably, the reaction of Reaction Scheme 1 may be performed at 10 to 30° C., and the reaction of Reaction Scheme 2 may be performed at 55 to 70° C., and the reaction of Reaction Scheme 3 may be performed at 20 to 30° C. These reactions are allowed to be completed after confirming that the starting material is completely consumed, through NMR, or the like. Once the reactions are completed, after an extraction process is performed, the solvent may be distilled under reduced pressure, and a target material may be separated and purified by general methods such as column chromatography, etc.

Further, the present invention provides a composition for depositing a transition metal-containing thin film including: the transition metal compound as described above.

Preferably, the composition for depositing a transition metal-containing thin film may include the transition metal compound of the present invention alone as the precursor.

The transition metal compound of the present invention may be represented by Chemical Formula 1 as described above, and preferably M in Chemical Formula 1 may be titanium, zirconium, or hafnium.

In the composition for depositing a transition metal-containing thin film according to an exemplary embodiment of the present invention may include a compound wherein $R_1$ to $R_6$ and $R_{11}$ to $R_{13}$ in Chemical Formula 1 above are each independently a hydrogen atom or a (C1-C7)alkyl group.

Further, the composition for depositing a transition metal-containing thin film according to an exemplary embodiment of the present invention may include a compound wherein X in Chemical Formula 1 above is each independently a mono(C1-C20)alkylamino group, a di(C1-C20)alkylamino group, a mono(C1-C20)alkylamide group, a di(C1-C20)alkylamide group, a (C1-C20)alkyl group, or a (C1-C20)alkoxy group.

Preferably, the composition for depositing a transition metal-containing thin film according to an exemplary embodiment of the present invention may include only the transition metal compound represented by Chemical Formula 1, which is used as the precursor. In view of depositing a transition metal thin film having high heat stability, excellent step coverage, and a high density, in the transition metal compound represented by Chemical Formula 1, $R_1$ to $R_6$ may be each independently a hydrogen atom or a (C1-C7) alkyl group; X may be each independently a mono(C1-C20) alkylamino group, a di(C1-C20)alkylamino group, a (C1-C20)alkyl group or a (C1-C20)alkoxy group.

Further, the present invention provides a transition metal-containing thin film prepared by using the composition for depositing a transition metal-containing thin film including the transition metal compound as described above.

The transition metal-containing thin film of the present invention may be prepared to have a high density, a high purity, and a good quality by using the composition for depositing a transition metal-containing thin film that includes the transition metal compound having high heat stability and high volatility according to the present invention as the precursor.

The transition metal-containing thin film of the present invention may be prepared by conventional methods used in the art, for example, metal organic chemical vapor deposition (MOCVD), atomic layer deposition (ALD), low pressure chemical vapor deposition (LPCVD), plasma enhanced chemical vapor deposition (PECVD), plasma enhanced atomic layer deposition (PEALD), etc.

The transition metal-containing thin film of the present invention is prepared by using the composition for depositing a transition metal-containing thin film that includes the transition metal compound of the present invention as the precursor, and is not limited thereto. For example, the transition metal-containing thin film may be a transition metal oxide film, a transition metal nitride film, a transition metal carbon nitride film or a transition metal silicon nitride film, and may be a gate insulating film of a transistor or a dielectric film of a capacitor.

In addition, the present invention provides a preparation method of a transition metal-containing thin film using the composition for depositing a transition metal-containing thin film of the present invention.

Preferably, in the preparation method of a transition metal-containing thin film of the present invention, the transition metal-containing thin film may be prepared by using the transition metal compound of the present invention alone as the precursor for thin film deposition.

In the preparation method of a transition metal-containing thin film according to an exemplary embodiment of the present invention, deposition conditions may be controlled according to desired structures or heat characteristics of the thin film. Examples of the deposition conditions according to an exemplary embodiment of the present invention may include a feed flow rate of the composition for depositing a transition metal-containing thin film which contains the transition metal compound, feed flow rates of a reaction gas and a carrier gas, a pressure, a radio frequency (RF) power, a substrate temperature, etc. As non-limited examples of the deposition conditions, the feed flow rate of the composition for depositing a transition metal-containing thin film may be controlled within a range of 10 to 1000 cc/min, the flow rate of the carrier gas may be controlled within a range of 10 to 1000 cc/min, the flow rate of the reaction gas may be controlled within a range of 1 to 1000 cc/min, the pressure may be controlled within a range of 0.5 to 10 torr, the RF power may be controlled within a range of 200 to 1000 W, and the substrate temperature may be controlled within a range of 150 to 400° C., but are not limited thereto.

The reaction gas used in the preparation method of the transition metal-containing thin film of the present invention is not limited, and may be one selected from hydrogen ($H_2$), hydrazine ($N_2H_4$), ozone ($O_3$), ammonia ($NH_3$), nitrogen ($N_2$), silane ($SiH_4$), borane ($BH_3$), diborane ($B_2H_6$) and phosphine ($PH_3$), or a mixed gas containing one or more thereof, and the carrier gas may be selected from nitrogen ($N_2$), argon (Ar) and helium (He), or a mixed gas containing two or more thereof.

A substrate used in the preparation method of the transition metal-containing thin film according to an exemplary embodiment of the present invention may be a substrate including at least one semiconductor material such as Si, Ge, SiGe, GaP, GaAs, SiC, SiGeC, InAs, and InP; a silicon on insulator (SOI) substrate; a quartz substrate; or a glass substrate for a display; a flexible plastic substrate such as polyimide, polyethylene terephthalate (PET), polyethylene naphthalate (PEN), polymethyl methacrylate (PMMA), polycarbonate (PC), polyether sulfone (PES), polyester, etc.; but the present invention is not limited thereto.

In addition, the transition metal-containing thin film may be directly formed on the substrate, and further, a plurality of conductive layers, dielectric layers, insulation layers, or the like, may be formed between the substrate and the transition metal-containing thin film.

Hereinafter, the present invention will be described in more detail through Examples. The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe most appropriately the best method he or she knows for carrying out the invention. Therefore, the configurations described in the embodiments and drawings of the present invention are merely the most preferable one embodiment but do not represent all of the technical spirit of the present invention. Thus, the present invention should be construed as including various equivalents and modifications that are capable of being substituted at the time of filing of the present application.

[Example 1] Synthesis of $(C_5H_4)CH_2Si(CH_3)_2N(CH_3)Zr(N(CH_3)_2)_2$

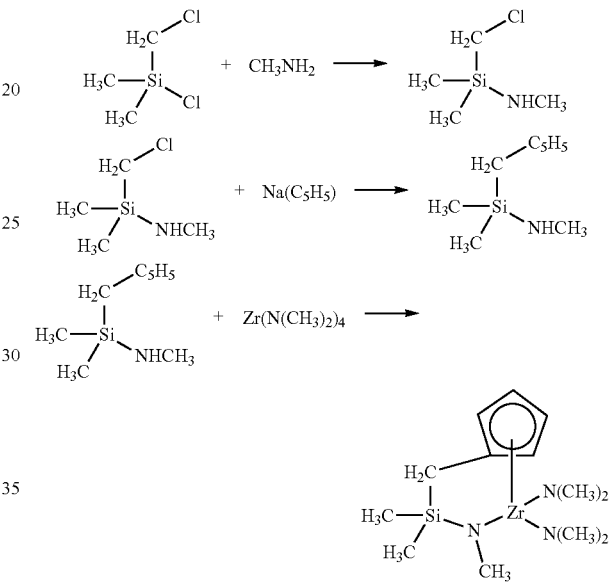

Synthesis of $ClCH_2Si(CH_2)_2NH(CH_3)$

Chloro(chloromethyl)dimethylsilane (228 g, 1.6 mol) was added to 1500 ml of pentane, and then methylamine (100 g, 3.2 mol) was added thereto at −10° C., and the obtained mixture was stirred at room temperature (25° C.) for 24 hours. After the reaction was completed, the amine salt was removed by filtration, and then, the solvent and volatile by-products were removed under reduced pressure. The obtained mixture was distilled under reduced pressure to obtain 197.1 g (89.4%) of the title compound.

$^1$H-NMR (solvent: benzene-$d_6$, ppm) δ 2.50 (2H, s, ClCH$_2$Si), 2.25 (3H, d, CH$_3$NH), 1.21 (1H, m, CH$_3$NH), 0.01 (6H, s, Si(CH$_3$)$_2$).

Synthesis of $(C_5H_5)CH_2Si(CH_2)_2NH(CH_3)$

Sodium cyclopentadiene (132.4 g, 1.5 mol) was dissolved in 2000 ml of tetrahydrofuran at 0° C., and then, methylamino(cyclopentadienylmethyl)dimethylsilane (197.1 g, 1.4 mmol) was added thereto at room temperature (25° C.). The obtained mixture was stirred under reflux for 24 hours. After the reaction was completed, the mixture was filtered to remove a salt of sodium chloride, and the solvent and volatile by-products were removed under reduced pressure, followed by distillation under reduced pressure (60° C.

which is based on a temperature of a reactor, 0.2 torr), thereby obtaining 75 g (31.3%) of the title compound.

$^1$H-NMR (solvent: benzene-$d_6$, ppm) δ 5.81 (5H, s, CpCH2Si), 2.83 (3H, d, CH$_3$NH), 1.83 (2H, s, CpCH2Si), 0.03 (6H, s, Si(CH3)2)

Synthesis of $(C_5H_4)CH_2Si(CH_3)_2N(CH_3)Zr(N(CH_3)_2)_2$

Tetrakis dimethylamino zirconium (80 g, 0.3 mol) was dissolved in 500 ml of pentane, and then, methylamino (cyclopentadienylmethyl)dimethyl silane (50 g, 0.3 mol) was added thereto at 0° C., and the obtained mixture was stirred at room temperature (25° C.) for 24 hours. After the reaction was completed, the solvent and volatile by-products were removed under reduced pressure, followed by distillation under reduced pressure (95° C. which is based on a temperature of the reactor, 0.2 torr), thereby obtaining 67 g (65%) of the title compound.

$^1$H-NMR (solvent: benzene-$d_6$, ppm) δ 5.83 (4H, q, CpCH2Si), 3.11 (3H, s, CH3N), 2.90 (12H, s, Zr[N(CH3)2]2), 1.99 (2H, s, CpCH2Si), 0.15 (6H, s, Si(CH3)2).

Example 2

Synthesis of $(C_5H_4)CH_2Si(CH_3)_2N(CH_3)Hf(N(CH_3)_2)_2$

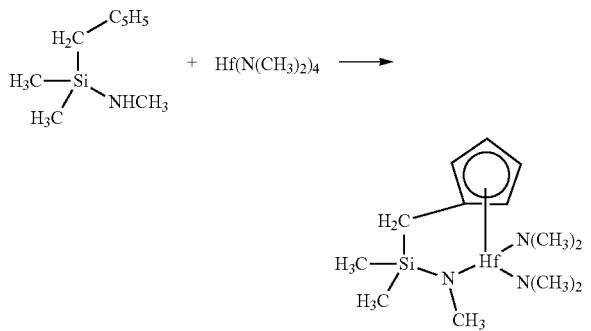

Tetrakis dimethylamino hafnium (177 g, 0.5 mol) was dissolved in 500 ml of pentane, and then, methylamino (cyclopentadienylmethyl)dimethyl silane (84 g, 0.5 mol) was added thereto at 0° C., and the obtained mixture was stirred for 24 hours. After the reaction was completed, the solvent and volatile by-products were removed under reduced pressure, followed by distillation under reduced pressure (130° C. which is based on a temperature of a reactor, 0.3 torr), thereby obtaining 151 g (70%) of the title compound.

$^1$H-NMR (solvent: benzene-$d_6$, ppm) δ 5.78 (4H, q, CpCH2Si), 3.09 (3H, s, CH3N), 2.94 (12H, s, Hf[N(CH3)2]2), 1.97 (2H, s, CpCH2Si), 0.13 (6H, s, Si(CH3)2).

Example 3

Synthesis of $(C_5H_4)CH_2Si(CH_3)_2N(CH_3)Ti(N(CH_3)_2)_2$

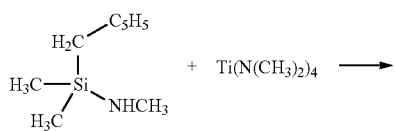

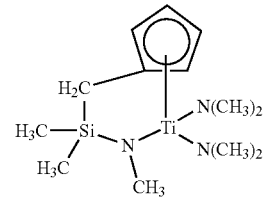

Tetrakis dimethylamino titanium (112 g, 0.5 mol) was dissolved in 500 ml of pentane, and then, methylamino (cyclopentadienylmethyl)dimethyl silane (84 g, 0.5 mol) was added thereto at 0° C., and the obtained mixture was stirred for 24 hours. After the reaction was completed, the solvent and volatile by-products were removed under reduced pressure, followed by distillation under reduced pressure (118° C. which is based on a temperature of a reactor, 0.3 torr), thereby obtaining 90 g (60%) of the title compound.

$^1$H-NMR (solvent: benzene-$d_6$, ppm) δ 5.70 (4H, q, CpCH2Si), 3.41 (3H, s, CH3N), 3.05 (12H, s, Ti[N(CH3)2]2), 1.94 (2H, s, CpCH2Si), 0.12 (6H, s, Si(CH3)2).

[Example 4] Synthesis of $(C_5H_4)CH_2Si(CH_3)_2N(CH_2CH_2CH_3)Zr(N(CH_3)_2)_2$

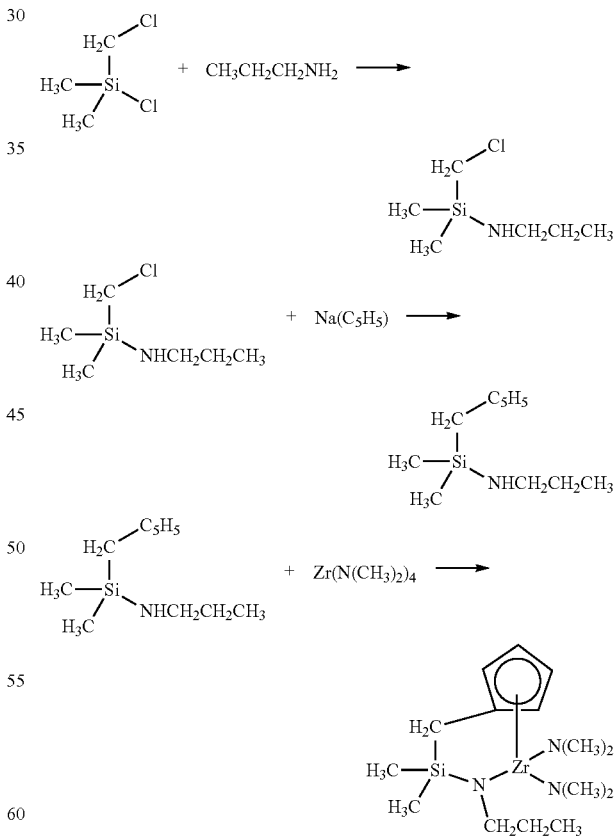

Synthesis of $ClCH_2Si(CH_3)_2NH(CH_2CH_2CH_3)$

Chloro(chloromethyl)dimethylsilane (109 g, 0.8 mol) was added to 1000 ml of pentane, and then N-propylamine (90 g, 1.5 mol) was added thereto at −10° C., and the obtained mixture was stirred at room temperature (25° C.) for 24 hours. After the reaction was completed, the amine salt was removed by filtration, and then, the solvent and volatile by-products were removed under reduced pressure. The obtained mixture was distilled under reduced pressure to obtain 100 g (79%) of the title compound.

$^1$H-NMR (solvent: benzene-d$_6$, ppm) δ 2.50 (2H, s, ClCH$_2$Si), 2.48 (2H, t, CH3CH2CH2NH), 1.19 (2H, m, CH3CH2CH2NH), 0.75 (3H, t, CH3CH2CH2NH), 0.03 (6H, s, Si(CH3)2).

Synthesis of (C$_5$H$_5$)CH$_2$Si(CH$_3$)$_2$NH(CH$_2$CH$_2$CH$_3$)

Sodium cyclopentadiene (53 g, 0.6 mol) was dissolved in 250 ml of tetrahydrofuran at 0° C., and then N-propyl amino(cyclopentadienylmethyl)dimethylsilane (53 g, 0.6 mol) was added thereto at room temperature (25° C.). The obtained mixture was stirred under reflux for 24 hours. After the reaction was completed, the mixture was filtered to remove a salt of sodium chloride, and the solvent and volatile by-products were removed under reduced pressure, followed by distillation under reduced pressure (80° C. which is based on a temperature of a reactor, 0.2 torr), thereby obtaining 65 g (55%) of the title compound.

$^1$H-NMR (solvent: benzene-d6, ppm) δ 5.81 (5H, s, CpCH2Si), 2.55 (2H, t, CH3CH2CH2NH), 1.84 (2H, s, CpCH2Si), 1.289 (2H, m, CH3CH2CH2NH), 0.799 (3H, t, CH3CH2CH2NH), 0.04 (6H, s, Si(CH3)2).

Synthesis of (C$_5$H$_4$)CH$_2$Si(CH$_3$)$_2$N(CH$_2$CH$_2$CH$_3$)Zr(N(CH$_3$)$_2$)$_2$ Tetrakis dimethylamino zirconium (114 g, 0.4 mol) was dissolved in 500 ml of pentane, and then, propyl amino (cyclopentadienylmethyl)dimethyl silane (83.26 g, 0.4 mol) was added thereto at 0° C., and the obtained mixture was stirred at room temperature (25° C.) for 24 hours. After the reaction was completed, volatile by-products were removed under reduced pressure, followed by distillation under reduced pressure (130° C. which is based on a temperature of a reactor, 0.2 torr), thereby obtaining 140 g (85%) of the title compound.

$^1$H-NMR (solvent: benzene-d6, ppm) δ 5.84 (2H, t, CpCH2Si), 5.80 (2H, t, CpCH2Si), 3.38 (2H, t, CH3CH2CH2NH), 2.86 (12H, s, Zr[N(CH3)2]2), 1.99 (2H, s, CpCH2Si), 1.46 (2H, m, CH3CH2CH2NH), 0.88 (3H, t, CH3CH2CH2NH), 0.19 (6H, s, Si(CH3)2).

Example 5

Synthesis of (C$_5$H$_4$)CH$_2$Si(CH$_3$)$_2$N(CH$_2$CH$_2$CH$_3$)Hf(N(CH$_3$)$_2$)$_2$

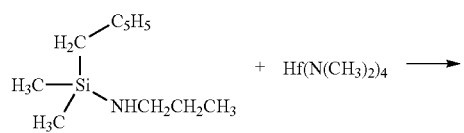 + Hf(N(CH$_3$)$_2$)$_4$ ⟶

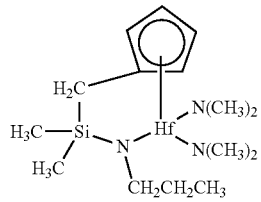

Tetrakis dimethylamino hafnium (142 g, 0.4 mol) was dissolved in 500 ml of pentane, and then, N-propyl amino (cyclopentadienylmethyl)dimethyl silane (78 g, 0.4 mol) was added thereto at 0° C., and the obtained mixture was stirred for 24 hours. After the reaction was completed, the solvent and volatile by-products were removed under reduced pressure, followed by distillation under reduced pressure (110° C. which is based on a temperature of a reactor, 0.2 torr), thereby obtaining 120 g (65%) of the title compound.

$^1$H-NMR (solvent: benzene-d$_6$, ppm) δ 5.82 (2H, t, CpCH2Si), 5.75 (2H, t, CpCH2Si), 3.33 (2H, t, CH3CH2CH2NH), 2.90 (12H, s, Hf[N(CH3)2]2), 1.98 (2H, s, CpCH2Si), 1.44 (2H, m, CH3CH2CH2NH), 0.88 (3H, t, CH3CH2CH2NH), 0.18 (6H, s, Si(CH3)2).

Example 6

Synthesis of (C$_5$H$_4$)CH$_2$Si(CH$_3$)$_2$N(CH$_2$CH$_2$CH$_3$)Ti(N(CH$_3$)$_2$)$_2$

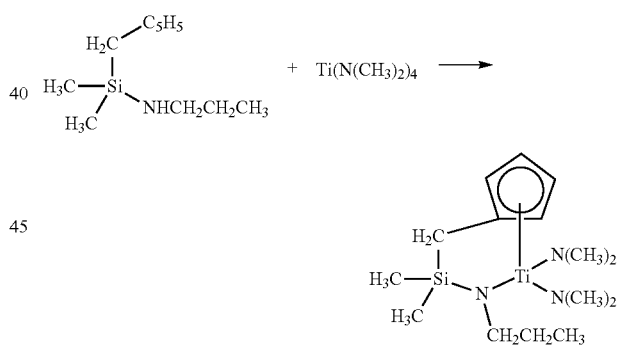

Tetrakis dimethylamino titanium (135 g, 0.6 mol) was dissolved in 500 ml of pentane, and then, N-propyl amino (cyclopentadienylmethyl)dimethyl silane (117 g, 0.6 mol) was added thereto at 0° C., and the obtained mixture was stirred for 24 hours. After the reaction was completed, the solvent and volatile by-products were removed under reduced pressure, followed by distillation under reduced pressure (150° C. which is based on a temperature of a reactor, 0.7 torr), thereby obtaining 118 g (60%) of the title compound.

$^1$H-NMR (solvent: benzene-d6, ppm) δ 5.74 (2H, t, CpCH2Si), 5.62 (2H, t, CpCH2Si), 3.62 (2H, t, CH3CH2CH2NH), 3.01 (12H, s, Ti[N(CH3)2]2), 1.96 (2H, s, CpCH2Si), 1.40 (2H, m, CH3CH2CH2NH), 0.94 (3H, t, CH3CH2CH2NH), 0.17 (6H, s, Si(CH3)2).

[Example 7] Synthesis of (C₅H₄)CH₂Si(CH₃)₂N(CH(CH₃)₂)Zr(N(CH₃)₂)₂

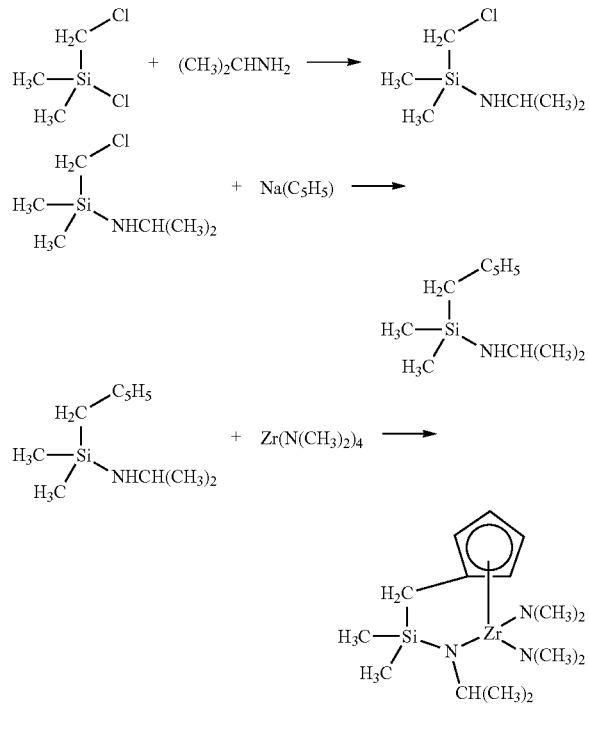

Synthesis of ClCH₂Si(CH₃)₂NH(CH(CH₃)₂)

Chloro(chloromethyl)dimethylsilane (130 g, 0.9 mol) was added to 1000 ml of pentane, and then isopropylamine (108 g, 1.8 mol) was added thereto at −10° C., and the obtained mixture was stirred at room temperature (25° C.) for 24 hours. After the reaction was completed, the amine salt was removed by filtration, and then, the solvent and volatile by-products were removed under reduced pressure. The obtained mixture was distilled under reduced pressure to obtain 120 g (79%) of the title compound.

¹H-NMR (solvent: benzene-d₆, ppm) δ 2.81 (1H, m, (CH3)2CHNH), 2.50 (2H, s, ClCH2Si), 0.89 (6H, d, (CH3)2CHNH), 0.04 (6H, s, Si(CH3)2)

Synthesis of (C₅H₅)CH₂Si(CH₃)₂NH(CH(CH₃)₂)

Sodium cyclopentadiene (102 g, 1.1 mol) was dissolved in 250 ml of tetrahydrofuran at 0° C., and then isopropyl amino(cyclopentadienylmethyl)dimethylsilane (184 g, 1.1 mol) was added thereto at room temperature (25° C.). The obtained mixture was stirred under reflux for 24 hours. After the reaction was completed, the mixture was filtered to remove a salt of sodium chloride, and the solvent and volatile by-products were removed under reduced pressure, followed by distillation under reduced pressure (80° C. which is based on a temperature of a reactor, 0.2 torr), thereby obtaining 105 g (74%) of the title compound.

¹H-NMR (solvent: benzene-d6, ppm) δ 5.97 (5H, s, CpCH2Si), 2.84 (1H, m, (CH3)2CHNH), 1.85 (2H, s, CpCH2Si), 0.94 (6H, d, (CH3)2CHNH), 0.05 (6H, s, Si(CH3)2).

Synthesis of (C₅H₄)CH₂Si(CH₃)₂N(CH(CH₃)₂)Zr(N(CH₃)₂)₂

Tetrakis dimethylamino zirconium (144 g, 0.5 mol) was dissolved in 500 ml of pentane, and then, isopropyl amino (cyclopentadienylmethyl)dimethyl silane (105 g, 0.5 mol) was added thereto at 0° C., and the obtained mixture was stirred for 24 hours. After the reaction was completed, the solvent and volatile by-products were removed under reduced pressure, followed by distillation under reduced pressure (130° C. which is based on a temperature of a reactor, 0.2 torr), thereby obtaining 195 g (94%) of the title compound.

¹H-NMR (solvent: benzene-d6, ppm) δ 5.86 (2H, t, CpCH2Si), 5.78 (2H, t, CpCH2Si), 4.01 (1H, m, (CH3)2CHN), 2.84 (12H, s, Zr[N(CH3)2]2), 1.99 (2H, s, CpCH2Si), 1.18 (6H, d, (CH3)2CHN), 0.27 (6H, s, Si(CH3)2).

[Example 8] Synthesis of (C₅H₄)CH₂Si(CH₃)₂N(CH₂CH₂CH₃)Zr(NC₄H₈)₂

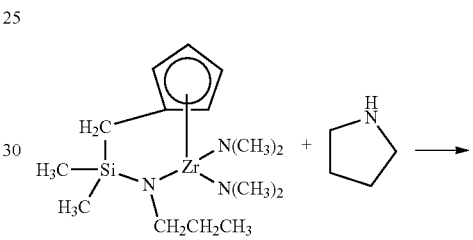

Synthesis of (C₅H₄)CH₂Si(CH₃)₂N(CH₂CH₂CH₃)Zr(NC₄H₈)₂

Pyrrolidine (13 g, 181 mmol) was slowly added to N-propylamino (cyclopentadienylmethyl)dimethyl silyl dimethyl amino zirconium (35 g, 90 mmol) at room temperature, followed by stirring under reflux for 24 hours. After the reaction was completed, volatile by-products were removed under reduced pressure, followed by distillation under reduced pressure (172° C. which is based on a temperature of a reactor, 0.2 torr), thereby obtaining 21 g (53%) of the title compound.

¹H-NMR (solvent: benzene-d6, ppm) δ 5.88 (2H, d, CpCH2Si), 5.86 (2H, d, CpCH2Si), 3.45 (3H, t, CH3CH2CH2N), 1.40 (2H, m, CH3CH2CH2N), 3.38 (8H, s, Zr(NC4H8)), 2.01 (2H, s, CpCH2Si), 0.88 (2H, t, CH3CH2CH2N), 0.20 (6H, s, Si(CH3)2).

[Example 9] Synthesis of (C₅H₄)CH₂Si(CH₃)₂N(CH₃)Zr(NC₄H₈)₂

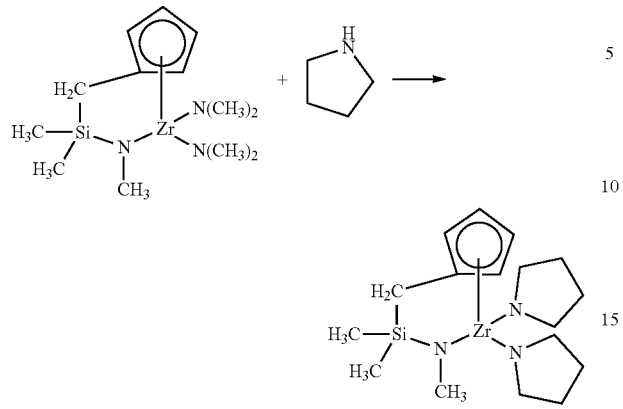

Synthesis of (C₅H₄)CH₂Si(CH₃)₂N(CH₃)Zr(NC₄H₈)₂

Pyrrolidine (6.7 g, 95 mmol) was slowly added to methyl amino (cyclopentadienylmethyl)dimethyl silyl dimethyl amino zirconium (17 g, 47 mmol) at room temperature, followed by stirring under reflux for 24 hours. After the reaction was completed, volatile by-products were removed under reduced pressure, followed by distillation under reduced pressure (115° C. which is based on a temperature of a reactor, 0.2 torr), thereby obtaining 15 g (38%) of the title compound.

¹H-NMR (solvent: benzene-d6, ppm) δ 5.89 (2H, d, CpCH2Si), 5.85 (2H, d, CpCH2Si), 3.09 (3H, s, CH3N), 3.40 (8H, s, Zr(NC4H8)), 2.00 (2H, s, CpCH2Si), 0.15 (6H, s, Si(CH3)2).

[Comparative Example 1] Synthesis of (C₅H₅)Zr(N(CH₃)₂)₃

2.3 M n-butyl lithium (520 g, 1.7 mol) was added to 3000 ml of hexane. After dimethylamine (79 g, 1.7 mol) was added thereto at 0° C., the obtained mixture was stirred at room temperature (25° C.) for 24 hours, 1000 ml of tetrahydrofuran was added thereto at room temperature (25° C.). Then, zirconium chloride (100 g, 0.4 mol) was slowly added thereto, followed by stirring for 24 hours. After the reaction was completed, the reaction mixture was filtered, and cracked cyclopentadiene (28 g, 0.4 mol) was added thereto at room temperature (25° C.), followed by stirring for 24 hours. After the reaction was completed, the solvent and volatile by-products were removed under reduced pressure, followed by distillation under reduced pressure, thereby obtaining 105 g (85%) of the title compound.

¹H-NMR (solvent: benzene-d6, ppm) δ 6.03 (5H, s, CpZr(N(CH₃)₂)₃), 2.89 (18H, s, CpZr(N(CH₃)₂)₃)

[Example 10] Preparation of Zirconium Silicate Thin Film Using (C₅H₄)CH₂Si(CH₃)₂N(CH₂CH₂CH₃)Zr(N(CH₃)₂)₂

A zirconium silicate thin film was prepared on a silicon substrate by atomic layer deposition. The silicon substrate was maintained at 300° C., and the (C₅H₄)CH₂Si(CH₃)₂N(CH₂CH₂CH₃)Zr(N(CH₃)₂)₂ precursor synthesized in Example 4 was charged in a stainless steel bubbler vessel, and maintained at 129° C. First, the precursor of Example 4 that was vaporized in the stainless steel bubbler vessel was transferred to the silicon substrate using argon gas (50 sccm) as a carrier gas, and adsorbed on the silicon substrate. Next, the zirconium silicate precursor compound was removed using argon gas (4000 sccm) for about 15 seconds. Then, ozone gas having a concentration of about 180 g/m³ was supplied at 500 sccm for 10 seconds to form a zirconium silicate thin film. At last, reaction by-products and residual reaction gas were removed using argon gas (4000 sccm) for about 10 seconds. The zirconium silicate thin film was formed by repeating 100 times the above-described process as one cycle.

[Example 11] Preparation of Zirconium Silicate Thin Film Using (C₅H₄)CH₂Si(CH₃)₂N(CH₃)Zr(N(CH₃)₂)₂

A thin film was formed in the same manner as in Example 10 except that the (C₅H₄)CH₂Si(CH₃)₂N(CH₃)Zr(N(CH₃)₂)₂ precursor synthesized in Example 1 was used instead of the (C₅H₄)CH₂Si(CH₃)₂N(CH₂CH₂CH₃)Zr(N(CH₃)₂)₂ precursor synthesized in Example 4, and the temperature of the stainless steel bubbler vessel was maintained at 120° C.

[Example 12] Preparation of Hafnium Silicate Thin Film Using (C₅H₄)CH₂Si(CH₃)₂N(CH₃)Hf(N(CH₃)₂)₂

A hafnium silicate thin film was prepared on a silicon substrate by atomic layer deposition. The silicon substrate was maintained at 300° C., and the (C₅H₄)CH₂Si(CH₃)₂N(CH₃)Hf(N(CH₃)₂)₂ precursor synthesized in Example 2 was charged in a stainless steel bubbler vessel, and maintained at 129° C. First, the hafnium silicate precursor that was vaporized in the stainless steel bubbler vessel was transferred to the silicon substrate using argon gas (50 sccm) as a carrier gas, and adsorbed on the silicon substrate. Next, a tin precursor compound was removed using argon gas (4000 sccm) for about 15 seconds. Then, ozone gas having a concentration of about 180 g/m³ was supplied at 500 sccm for 10 seconds to form a hafnium silicate thin film. At last, reaction by-products and residual reaction gas were removed using argon gas (4000 sccm) for about 10 seconds. The hafnium silicate thin film was formed by repeating 100 times the above-described process as one cycle.

[Experimental Example 1] Analysis of Transition Metal Silicate Thin Film Compositions of Examples 10 to 12

Table 1 below shows composition analysis results of the thin films deposited in Examples 10 to 12 by X-ray photoelectron spectroscopy.

TABLE 1

| Composition analysis results of deposited thin films using Experimental Examples 1 to 3 | | | | | |
|---|---|---|---|---|---|
| | Atom | | | | |
| Example | Zr | Hf | Si | O | C |
| Example 10 | 16.4 | 0 | 16 | 67.6 | 0 |
| Example 11 | 16.2 | 0 | 16.1 | 67.7 | 0 |
| Example 12 | 0 | 16.2 | 16 | 67.8 | 0 |

As shown in Table 1, it could be confirmed that a ratio of zirconium, silicon and oxygen was about 1:1:4, and zirconium silicate ($ZrSiO_4$) or hafnium silicate ($HfSiO_4$) was formed with a high purity without carbon impurity.

Further, as shown in Table 1, it could be appreciated that when the transition metal compound of the present invention including both the transition metal and the silyl group in one molecule was used as the precursor, the transition metal silicate film was formed, but when the compound of Comparative Example was used, only the transition metal oxide film was formed.

[Experimental Example 2] Step Coverage Characteristic of $(C_5H_4)CH_2Si(CH_3)_2N(CH_2CH_2CH_3)Zr(N(CH_3)_2)_2$ Thin Film In order to confirm the step coverage characteristic, a zirconium silicate thin film was formed on a trench wafer having an aspect ratio of about 1:6 using the deposition method described in Example 10. A result thereof was shown in FIG. 1.

As shown in FIG. 1, a high step coverage characteristic of 92% or more could be confirmed.

[Experimental Example 3] Step Coverage Characteristic of $(C_5H_4)CH_2Si(CH_3)_2N(CH_3)Zr(N(CH_3)_2)_2$ Thin Film In order to confirm the step coverage characteristic, a zirconium silicate thin film was formed on a trench wafer having an aspect ratio of about 1:6 using the deposition method described in Example 11. A result thereof was shown in FIG. 2.

Figure 2:
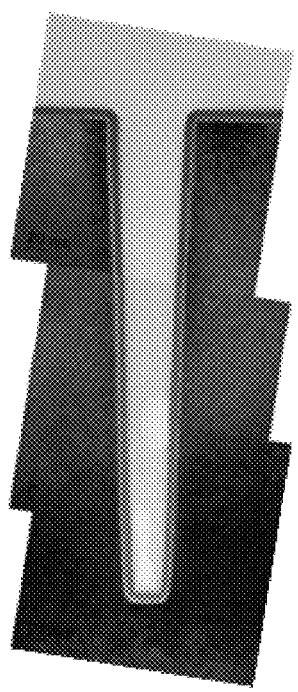
FIG. 2 shows a step coverage characteristic of Experimental Example 3.

As shown in FIG. 2, which is similar to FIG. 1, a high step coverage characteristic of 92% or more could be confirmed.

[Experimental Example 4] Step Coverage Characteristic of $(C_5H_4)CH_2Si(CH_3)_2N(CH_3)Hf(N(CH_3)_2)_2$ Thin Film In order to confirm the step coverage characteristic, a hafnium silicate thin film was formed on a trench wafer having an aspect ratio of about 1:6 using the deposition method described in Example 12. A result thereof was shown in FIG. 3.

Figure 3:
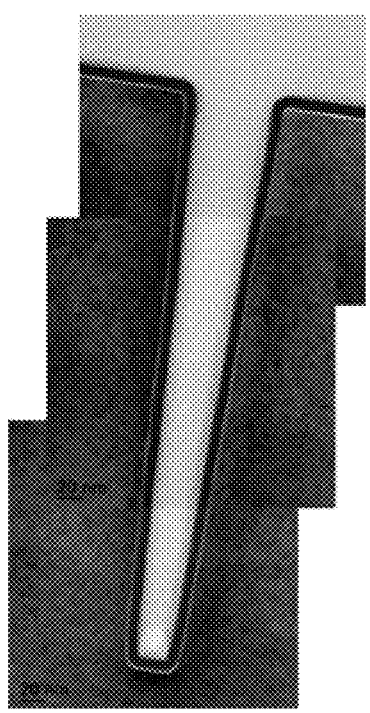
FIG. 3 shows a step coverage characteristic of Experimental Example 4.

As shown in FIG. 3, a high step coverage characteristic of 90% or more could be confirmed.

[Experimental Example 5] Evaluation of Heat Stability of Precursor

In order to evaluate heat stability of the precursors prepared in Examples 1, 4 to 8 and Comparative Example 1, temperatures at which pyrolysis occurs were measured using a differential scanning calorimeter (DSC3, Mettler Toledo) and shown in Table 2 below.

TABLE 2

Evaluation of heat stability

| Precursor | | Pyrolysis temperature (° C.) |
|---|---|---|
| Example 1 | $(C_5H_4)CH_2Si(CH_3)_2N(CH_3)Zr(N(CH_3)_2)_2$ | 289 |
| Example 4 | $(C_5H_4)CH_2Si(CH_3)_2N(CH_2CH_2CH_3)Zr(N(CH_3)_2)_2$ | 292 |
| Example 5 | $(C_5H_4)CH_2Si(CH_3)_2N(CH_2CH_2CH_3)Hf(N(CH_3)_2)_2$ | 324 |
| Example 7 | $(C_5H_4)CH_2Si(CH_3)_2N(CH(CH_3)_2)Zr(N(CH_3)_2)_2$ | 292 |
| Example 8 | $(C_5H_4)CH_2Si(CH_3)_2N(CH_2CH_2CH_3)Zr(NC_4H_8)_2$ | 306 |
| Comparative Example 1 | $(C_5H_5)Zr(N(CH_3)_2)_3$ | 282 |

It could be confirmed from the results in Table 2 that as compared to the $(C_5H_5)Zr(N(CH_3)_2)_3$ zirconium compound of Comparative Example 1, heat stability of the Examples was increased by comparing the pyrolysis temperatures with the onset temperature of DSC, which could be appreciated that it was possible to form a thin film at a higher temperature, resulting in an increase in a step coverage characteristic in fine patterns.

The invention claimed is:

1. A transition metal compound of Chemical Formula 1 below:

[Chemical Formula 1]

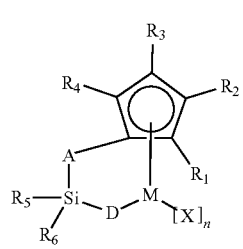

in Chemical Formula 1,

M is titanium, zirconium, or hafnium;

$R_1$ to $R_4$ are each independently a hydrogen atom or a (C1-C7)alkyl group;

$R_5$ and $R_6$ are each independently a hydrogen atom or a (C1-C20)alkyl group;

A is —$(CR_{11}R_{12})_a$—, $R_{11}$ and $R_{12}$ are each independently hydrogen or a (C1-C20)alkyl group, and a is an integer of 1 to 3;

D is —$N(R_{13})$—, and $R_{13}$ is a hydrogen atom or a (C1-C20)alkyl group;

X is each independently a di (C1-C20)alkylamino group or N—(C3-C20)heterocycloalkyl group; and n is an integer of 2.

2. The transition metal compound of claim 1, wherein the transition metal compound is selected from the following compounds:

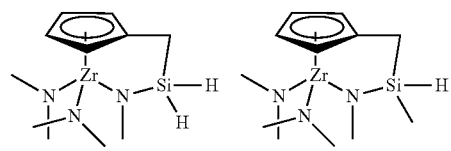

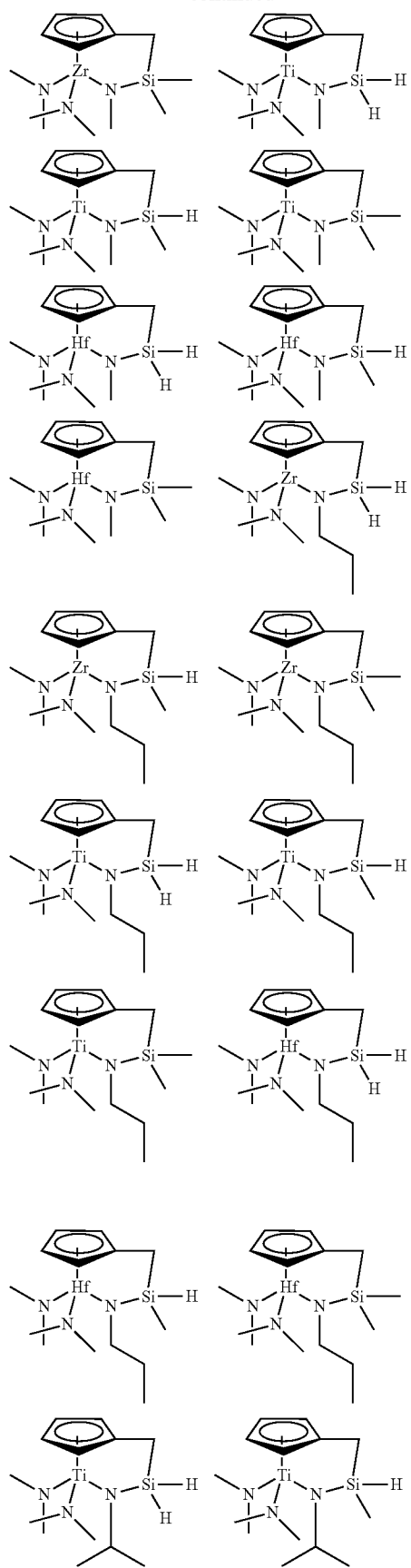
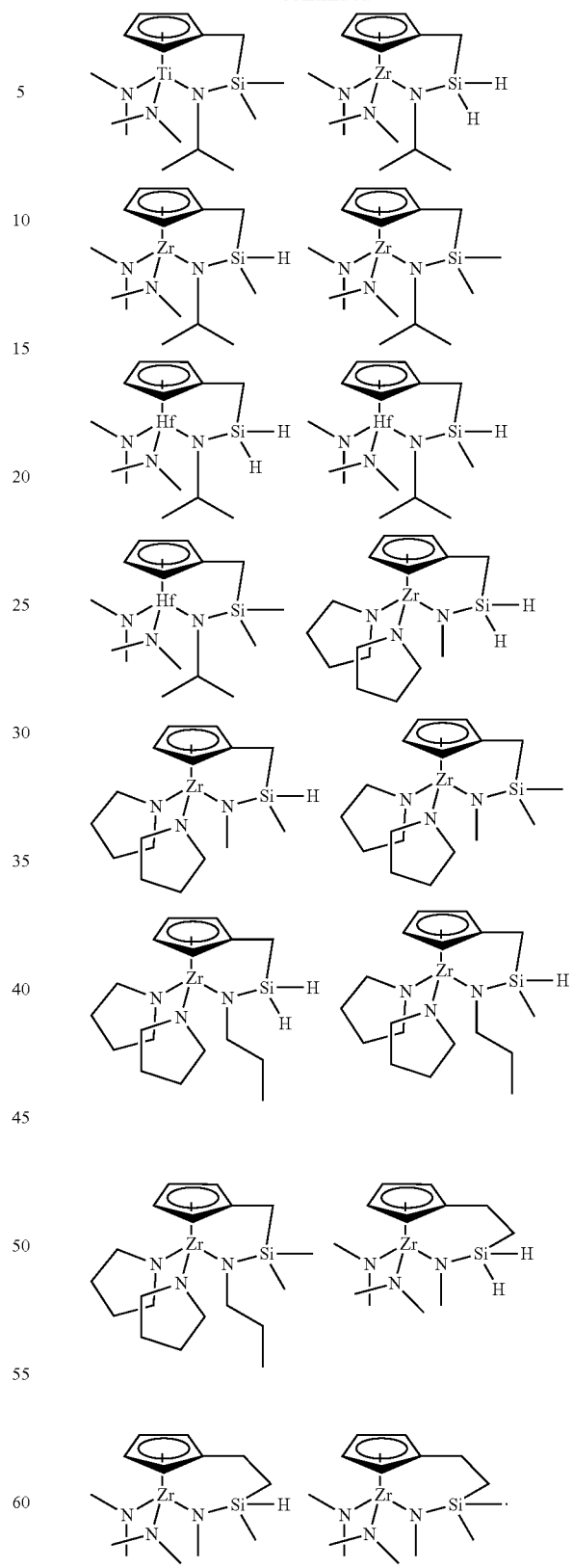
3. A method for preparing a transition metal compound of Chemical Formula 1 below comprising reacting Chemical Formula 2 below with Chemical Formula 3 below:

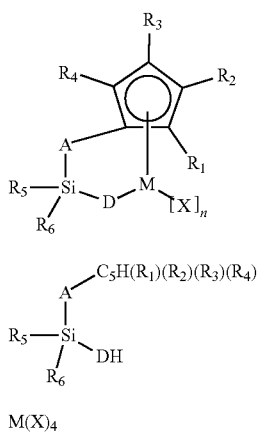

[Chemical Formula 1]

[Chemical Formula 2]

$M(X)_4$ [Chemical Formula 3]

in Chemical Formulas 1 to 3,
M is titanium, zirconium, or hafnium;
$R_1$ to $R_4$ are each independently a hydrogen atom or a (C1-C7)alkyl group;
$R_5$ and $R_6$ are each independently a hydrogen atom or a (C1-C20)alkyl group;
A is $-(CR_{11}R_{12})_a-$, $R_{11}$ and $R_{12}$ are each independently hydrogen or a (C1-C20)alkyl group, and a is an integer of 1 to 3;
D is $-N(R_{13})-$, and $R_{13}$ is a hydrogen atom or a (C1-C20)alkyl group;
X is each independently a di (C1-C20)alkylamino group or N—(C3-C20)heterocycloalkyl group; and
n is an integer of 2.

4. The method for preparing a transition metal compound of claim 3, comprising reacting Chemical Formula 4 below with Chemical Formula 5 below to prepare Chemical Formula 6 below, and then reacting the Chemical Formula 6 with Chemical Formula 7 below to provide Chemical Formula 2:

[Chemical Formula 4]

$DH_2$ [Chemical Formula 5]

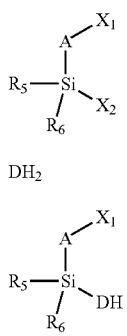

[Chemical Formula 6]

$M_1-C_5H(R_1)(R_2)(R_3)(R_4)$ [Chemical Formula 7]

in Chemical Formulas 4 to 7,
$M_1$ is an alkali metal;
$R_1$ to $R_4$ are each independently a hydrogen atom or a (C1-C20)alkyl group;
$R_5$ and $R_6$ are each independently a hydrogen atom or a (C1-C20)alkyl group;
A is $-(CR_{11}R_{12})_a-$, $R_{11}$ and $R_{12}$ are each independently hydrogen or a (C1-C20)alkyl group, and a is an integer of 1 to 3;
D is $-N(R_{13})-$, and $R_{13}$ is a hydrogen atom or a (C1-C20)alkyl group;
$X_1$ and $X_2$ are each independently halogen; and
n is an integer of 2.

5. A composition for depositing a transition metal silicate thin film comprising: the transition metal compound of Chemical Formula 1 below:

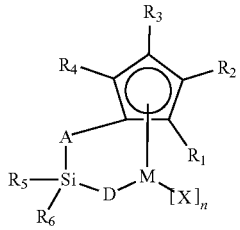

[Chemical Formula 1]

in Chemical Formula 1,
M is titanium, zirconium, or hafnium;
$R_1$ to $R_4$ are each independently a hydrogen atom or a (C1-C20)alkyl group;
$R_5$ and $R_6$ are each independently a hydrogen atom or a (C1-C20)alkyl group;
A is $-(CR_{11}R_{12})_a-$, $R_{11}$ and $R_{12}$ are each independently hydrogen or a (C1-C20)alkyl group, and a is an integer of 1 to 3;
D is $-N(R_{13})-$, and $R_{13}$ is a hydrogen atom or a (C1-C20)alkyl group;
X is each independently a di (C1-C20)alkylamino group or N—(C3-C20)heterocycloalkyl group; and
n is an integer of 2.

6. The composition for depositing a transition metal silicate thin film of claim 5, wherein a transition metal of the transition metal compound is zirconium, hafnium or titanium.

7. A preparation method of a transition metal silicate thin film comprising adding the composition of claim 5 to a substrate.

* * * * *